(12) United States Patent
Yamasaki et al.

(10) Patent No.: US 7,763,536 B2
(45) Date of Patent: Jul. 27, 2010

(54) METHOD OF MANUFACTURING A SEMICONDUCTOR DEVICE

(75) Inventors: Yasuo Yamasaki, Shiojiri (JP); Hiroki Kato, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 668 days.

(21) Appl. No.: 11/424,167

(22) Filed: Jun. 14, 2006

(65) Prior Publication Data
US 2006/0286790 A1    Dec. 21, 2006

(30) Foreign Application Priority Data
Jun. 21, 2005    (JP)    ............... 2005-180483

(51) Int. Cl.
*H01L 21/283*    (2006.01)
*H01L 21/441*    (2006.01)

(52) U.S. Cl. ...................... 438/614; 438/613
(58) Field of Classification Search ........................ None
See application file for complete search history.

(56) References Cited

U.S. PATENT DOCUMENTS

| 6,200,888 | B1 * | 3/2001 | Ito et al. ..................... 438/597 |
| 6,587,353 | B2 | 7/2003 | Sumikawa et al. |
| 7,157,363 | B2 * | 1/2007 | Suzuki et al. ................ 438/613 |
| 7,384,873 | B2 * | 6/2008 | Nagata ........................ 438/695 |
| 2003/0203661 | A1 * | 10/2003 | Ono et al. ..................... 439/65 |
| 2003/0207574 | A1 * | 11/2003 | Aiba et al. .................. 438/689 |

FOREIGN PATENT DOCUMENTS

| JP | A-57-072350 | 5/1982 |
| JP | A-01-247578 | 10/1989 |
| JP | A 2-272737 | 11/1990 |
| JP | A-03-070129 | 3/1991 |
| JP | A-05-251455 | 9/1993 |
| JP | 09074096 | * 3/1997 |
| JP | A-2001-332653 | 11/2001 |

* cited by examiner

*Primary Examiner*—Zandra Smith
*Assistant Examiner*—Pamela E Perkins
(74) *Attorney, Agent, or Firm*—Oliff & Berridge, PLC

(57) ABSTRACT

A method of manufacturing a semiconductor device includes preparing a semiconductor substrate having an electrode pad, a passivation film having an opening overlapping the electrode pad and an oxidized film formed in the opening, forming a resin projection on the passivation film, forming a metal layer on the passivation film and the resin projection, and forming an electrically connecting portion for connecting the electrode pad to the metal layer by substituting an electrical conductor for at least a part of the oxidized film.

5 Claims, 4 Drawing Sheets

(A)

(B)

(A)

(B)

(C)

(A)

(B)

(A)

(B)

(A)

(B)

METHOD OF MANUFACTURING A SEMICONDUCTOR DEVICE

The entire disclosure of Japanese Patent Application No. 2005-180483, filed Jun. 21, 2005 is expressly incorporated by reference herein.

BACKGROUND

1. Technical Field

The present invention relates to a method of manufacturing a semiconductor device.

2. Related Art

In order to miniaturize electronic components, it is preferable to use semiconductor devices having smaller dimensions. However, as the role of a semiconductor device has diversified, the packaging density of integrated circuits formed on a semiconductor chip has been on the increase. Along with such a technological trend, the number of pins of a semiconductor chip has also been increasing. In other words, today, more and more semiconductor devices are being developed that can simultaneously meet the two demands of miniaturizing products while increasing the packaging density of integrated circuits.

As a semiconductor device capable of meeting those demands, much attention has been focused on a type of semiconductor device in which a wiring pattern is formed on a semiconductor chip. The dimensions of this type of device can be made almost the same as those of a semiconductor chip. Therefore, compared with products manufactured by well-known semiconductor-packaging techniques, the above type of semiconductor device can be made smaller.

Even in the type of semiconductor device, however, a level of reliability is needed that is equal to or higher than that of those provided by known techniques. Furthermore, there has been a desire to develop a method of efficiently manufacturing such a type of semiconductor device while maintaining a high level of reliability.

JP-A-2-272737 is an example of related art.

SUMMARY

An advantage of the present invention is to provide a method of efficiently manufacturing a semiconductor device having high reliability.

A method of manufacturing a semiconductor device according to one aspect of the invention includes preparing a semiconductor substrate having an electrode pad, a passivation film having an opening overlapping the electrode pad and an oxidized film formed in the opening, forming a resin projection on the passivation film, forming a metal layer on the passivation film and the resin projection, and forming an electrically connecting portion for electrically connecting the electrode pad to the metal layer by substituting an electrical conductor for at least a part of the oxidized film. According to the above aspect of the invention, after the formation of the metal layer, electrical connection is made between the metal layer and the electrode pad. This enables efficient manufacturing of a semiconductor device having enhanced reliability in electrical connection.

In the above method, in the process of electrically connecting the electrode pad to the metal layer, the electrically connecting portion may be formed by substituting the electrical conductor for at least a part of the oxidized film by immersion plating. This allows the electrically connecting portion to be formed without removing the oxidized film, resulting in more efficient manufacturing of a semiconductor device.

In the above method, it is preferable that the electrode pad is formed of aluminum and the electrically connecting portion is formed of nickel.

In the above method, it is also preferable that a second metal layer is formed on the electrically connecting portion and the metal layer. This enables manufacturing of a more highly reliable semiconductor device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
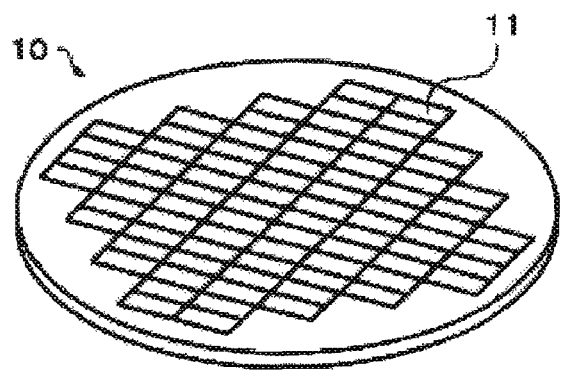
FIGS. 1A and 1B are explanatory views showing a method of manufacturing a semiconductor device according to an embodiment of the invention.
Figure 1:
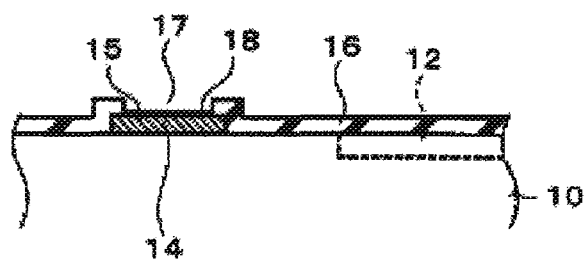
Figure 2:
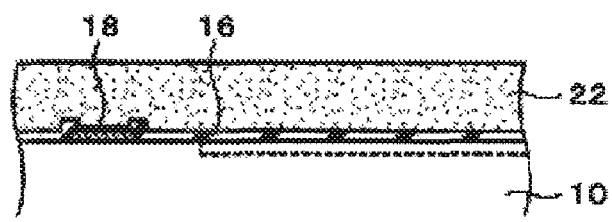
FIGS. 2A to 2C are explanatory views showing a method of manufacturing a semiconductor device according to the embodiment of the invention.
Figure 2:
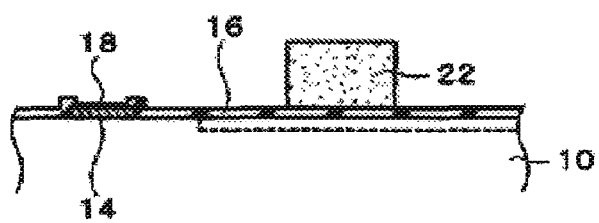
Figure 2:
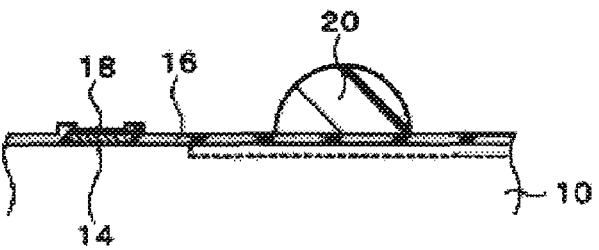
Figure 3:
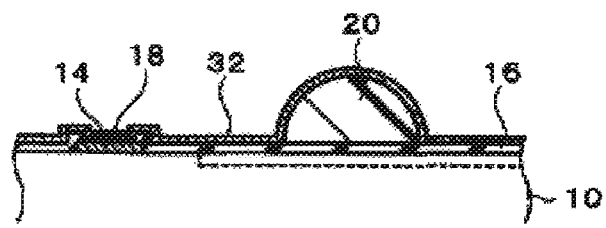
FIGS. 3A and 3B are explanatory views showing a method of manufacturing a semiconductor device according to the embodiment of the invention.
Figure 3:
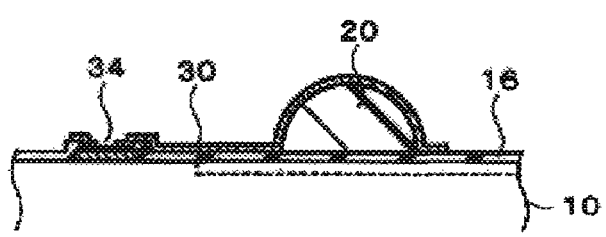
Figure 4:
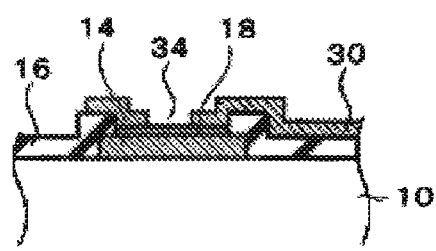
FIGS. 4A and 4B are explanatory views showing a method of manufacturing a semiconductor device according to the embodiment of the invention.
Figure 4:
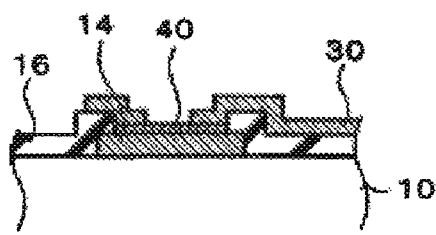

Embodiments of the invention will be described with reference to the attached drawings. However, the invention will not be limited to the following embodiments. FIGS. 1A to 7 illustrate a method of manufacturing a semiconductor device according to an embodiment of the invention.

The method of manufacturing a semiconductor device according to the embodiment of the invention includes preparing a semiconductor substrate 10. The semiconductor substrate 10 may be a silicon substrate, for example. Alternatively, the semiconductor substrate 10 may be a wafer substrate (see FIG. 1A). The wafer semiconductor substrate 10 may include an area 11 on which a plurality of semiconductor devices is formed. Further alternatively, the semiconductor substrate 10 may be in chip form. One or more integrated circuits 12 (an integrated circuit in a semiconductor chip and plural integrated circuits in a semiconductor wafer) may be formed on the semiconductor substrate 10 (see FIG. 1B). The structure of the integrated circuit 12 is not specifically limited. For example, the integrated circuit 12 may have an active element such as a transistor, as well as passive elements such as a resistor, a coil and a capacitor.

As shown in FIG. 1B, the semiconductor substrate 10 has an electrode pad 14. The electrode pad 14 may be electrically connected to the inside of the semiconductor substrate 10. Alternatively, the electrode pad 14 may be electrically connected to the integrated circuit 12. The electrode pad 14 may include an electrical conductor that is not electrically connected to the integrated circuit 12. For example, the electrical pad 14 may be formed of aluminum. Also, the electrical pad 14 may be a part of an internal wiring of the semiconductor substrate 10. In this case, the electrode pad 14, as a part of the internal wiring thereof, may be used for electrical connection with an external component. The electrode pad 14 may bee formed of metal such as copper or aluminum.

As shown in FIG. 1B, the semiconductor substrate 10 has a passivation film 16. The passivation film 16 has an opening 17 formed therein. The opening 17 is formed so as to overlap the electrode pad 14. The opening 17 may be formed so as to overlap the central area of the electrode pad 14. The passivation film 16 may be formed so as to partially cover the electrode pad 14. For example, the passivation film 16 may be an inorganic insulation film made of a material such as $SiO_2$ or SiN. Alternatively, the passivation film 16 may be a film made of an organic insulator such as polyimide resin.

As shown in FIG. 1B, the semiconductor substrate 10 has an oxidized film 18 that covers an area 15 overlapping the opening 17 of the passivation film 16 on the electrode pad 14. The oxidized film 18 may be formed in the opening 17 of the passivation film 16. Alternatively, the oxidized film 18 may be formed on the electrode pad 14.

The method of manufacturing a semiconductor device according to the embodiment thereof includes forming a resin projection 20 on the passivation film 16 (see FIG. 2C). The resin projection 20 may be formed of a well-known material. For example, the resin projection 20 may be formed of resin such as polyimide resin, silicon-modified polyimide resin, epoxy resin, silicon-modified epoxy resin, benzocyclobutene (BCB), polybenzoxazole (PBO) or phenol resin. The method of forming the resin projection 20 is not specifically limited. An exemplary method thereof will be described below, referring to FIGS. 2A to 2C. Firstly, as shown in FIG. 2A, a resin material 22 is disposed on the passivation film 16 (the semiconductor substrate 10). Then, as shown in FIG. 2B, the resin material 22 is patterned thereon. After the patterning, the resin projection 20 may be formed as shown in FIG. 2C, by hardening the resin material 22 (for example, by thermal hardening thereof). The configuration of the resin projection 20 is not specifically limited. For example, the resin projection 20 may be formed in a straight line (see FIG. 6). In this situation, the resin projection 20 may be formed so as to extend along the boundary of the area 11 of the semiconductor substrate 10. When the area 11 has a rectangular shape, the resin projection 20 may be formed so as to extend along the long side of the rectangular area 11. Also, the resin projection 20 may have a rounded surface, wherein the cross section thereof may be in a semicircular shape. In the process of forming the resin projection 20, the surface thereof can be rounded by melting and then hardening the resin material 22. Alternatively, the resin projection 20 may be formed in a hemispheric shape (not shown in the figures). Additionally, the resin projection 20 may be disposed so as to avoid the opening 17 of the passivation film 16.

The method of manufacturing a semiconductor device according to the embodiment thereof includes forming a metal layer 30 on the passivation film 16 and the resin projection 20 (see FIG. 3B). The process of forming the metal player 30 is not specifically limited. For example, the metal layer 30 may be formed by forming a metal foil 32 by sputtering (see FIG. 3A), and then performing the patterning thereof (see FIG. 3B). In short, the metal layer 30 may be patterned. The metal layer 30 may be a wiring pattern. The structure of the metal layer 30 is not specifically limited, either. By way of example, the metal layer 30 may be formed of a plurality of layers. In this case, the metal layer 30 may include a first layer made of titanium-tungsten and a second layer made of gold (not shown in the figures). Alternatively, the metal layer 30 may be formed of a single layer. The metal layer 30 may be formed so as to contact with the passivation film 16. In that case, the metal layer 30 may contact therewith at both sides of the resin projection 20. Further alternatively, the metal layer 30 may be formed so as to contact with the oxidized film 18. In this situation, the metal layer 30 may be formed so as to partially enter the opening 17 of the passivation film 16. Still further alternatively, the metal layer 30 may be formed so as to partially expose the oxidized film 18. For example, the metal layer 30 may be formed so as to have a through hole 34 for exposing the oxidized film 18, as shown in FIG. 3B.

The method of manufacturing a semiconductor device according to the embodiment thereof includes forming an electrically connecting portion 40 for electrically connecting the electrode pad 14 to the metal layer 30 by substituting an electrical conductor for at least a part of the oxidized film 18, as shown in FIGS. 4A and 4B. In this process, the entire oxidized film 18 may be substituted by the electrical conductor to form the electrically connecting portion 40 (see FIG. 4B). The process may be performed, for example, by immersion plating. In other words, immersion plating may be used to substitute the electrical conductor for the oxidized film 18 to form the electrically connecting portion 40. When the metal layer 30 has the through hole 34 for exposing the oxidized film 18, the oxidized film 18 can contact with a plating bath (plating solution), whereby immersion plating can be performed. Additionally, since the metal layer 30 is formed so as to contact with the oxidized film 18, the electrically connecting portion 40 can contact with the metal layer 30 without fail. Although the material of the electrically connecting portion 40 is not specifically limited, nickel may be used as the material. In this case, the electrode pad 14 may be formed of aluminum.

Figure 5:
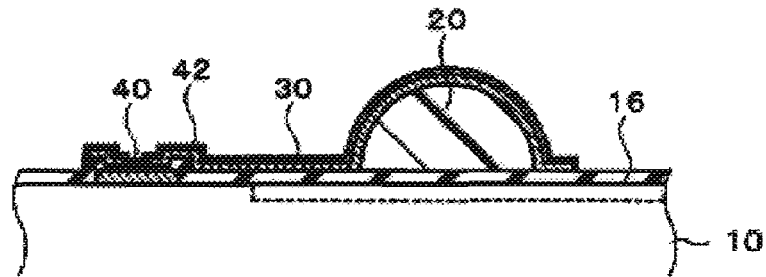
FIG. 5 is an explanatory view showing a method of manufacturing a semiconductor device according to the embodiment of the invention.
Figure 6:
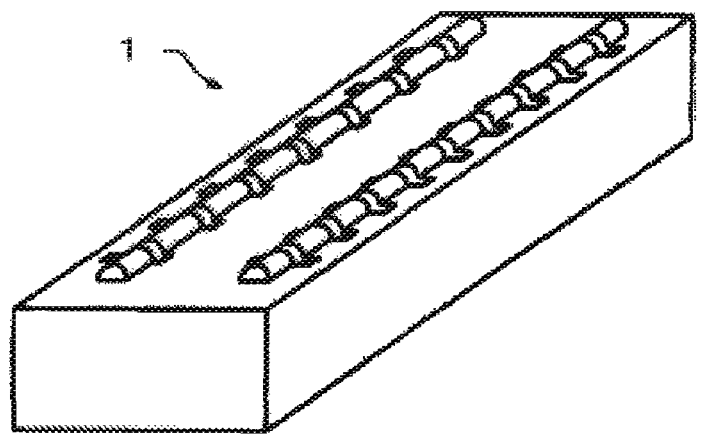
FIG. 6 shows a semiconductor device manufactured by the method according to the embodiment of the invention.

The method of manufacturing a semiconductor device according to the embodiment thereof may include forming a second metal layer 42 on the metal layer 30 and the electrically connecting portion 40, as shown in FIG. 5. The second metal layer 42 can enhance electrical connection reliability between the metal layer 30 and the electrically connecting portion 40. Alternatively, the metal layer 42 may be formed simultaneously with the electrically connecting portion 40. In other words, when the metal layer 30 is formed of the same metal as that of the electrode pad 14, immersion plating allows the metal layer 42 to be simultaneously formed with the electrically connecting portion 40 on the electrode pad 14, as well as to be simultaneously formed on the metal layer 30. Even if the material of the metal layer 30 is different from that of the electrode pad 14, as long as the material of the former is receptive to immersion plating, immersion plating enables simultaneous formation of the metal layer 42 and the electrically connecting portion 40. However, without forming the second metal layer 42, the process of manufacturing a semiconductor device may be completed (see FIG. 4B). Then, through a process of cutting the semiconductor substrate 10 into individual chips, an inspecting process and the like, a semiconductor device 1 as shown in FIG. 6 may be manufactured.

In general, metal oxidization occurs due to contact of metal with air (oxygen), resulting in the formation of an oxidized film, whose electrical resistance is higher than metal. As a result, the formation of such an oxidized film on an electrical pad blocks electrical connection between the electrode pad and another conductive member. For this reason, an oxidized film formed on an electrode pad has been removed before electrically connecting the electrode pad to another conductive member.

Meanwhile, as described earlier, in the method according to the embodiment of the invention, the electrically connecting portion 40 is formed by substituting the electrical conductor for the oxidized film 18. Accordingly, this method enables the formation of the electrically connecting portion 40 without removing the oxidized film 18. That is to say, the electrode pad 14 can be electrically connected to the metal layer 30 without removing the oxidized film 18. Therefore, the method enables efficient manufacturing of a highly reliable semiconductor device.

When an oxidized film is formed on an electrode, argon gas is usually used to remove the oxidized film. Argon gas, however, is known to affect resin and cause the surface carbonization of resin. Carbonized resin has lower insulation resistance. For this reason, when a plurality of wirings is formed on a resin surface, removal of an oxidized film is assumed to cause a reduction in insulation resistance between the wirings.

However, the method described above does not require the process of removing an oxidized film. Thus, the method enables manufacturing of a semiconductor device without reducing the surface insulation resistance of the resin projection 20. Consequently, a highly reliable semiconductor device can be obtained. Moreover, when the metal layer 42 is formed on the metal layer 30, a thick conductive layer can be formed by plating. This increases the strength of a wiring layer, thereby reducing the incidences of disconnection and crack associated with the use condition of a semiconductor device. Furthermore, a great reduction in wiring resistance allows high-speed signal transmission.

Figure 7:
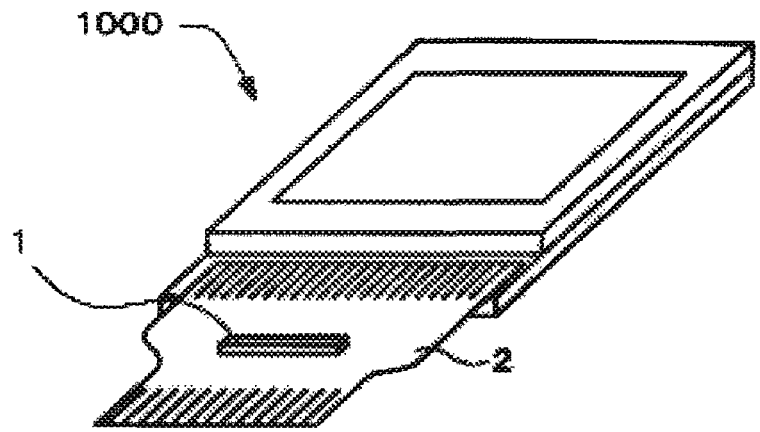
FIG. 7 shows an electronic module incorporating the semiconductor device manufactured according to the embodiment of the invention.

FIG. 7 shows an electronic module 1000 incorporating the above semiconductor device 1. In the example shown in FIG. 7, the semiconductor device 1 is mounted on a substrate 2. In this case, the substrate 2 may be a rigid substance (such as a glass substrate or a silicon substrate), or a flexible substrate (such as a film substrate). The semiconductor device 1 may be mounted in such a manner that a face having the metal layer 30 formed thereon is opposed to the substrate 2. In this case, a wiring formed on the substrate 2 may be contacted with the metal layer 30 to be electrically connected therewith. Specifically, the wiring on the substrate 2 may be brought into contact with and connected to a part of the metal layer 30 overlapping an upper end portion of the resin projection 20. In this method, elastic force of the resin projection 20 presses the metal layer 30 against the wiring on the substrate 2. Therefore, the method can provide a semiconductor device having enhanced reliability of electrical connection. Also, the semiconductor device 1 may be attached to the substrate 2 with an adhesive (a resin adhesive). The electronic module 1000 may be a display device, such as a liquid crystal display device or an EL (Electrical Luminescence) display device. The semiconductor device 1 may be a driver IC that controls a display device.

MODIFICATION

A modification of the embodiment of the invention will now be described with reference to FIGS. 8 to 10.

Figure 8:
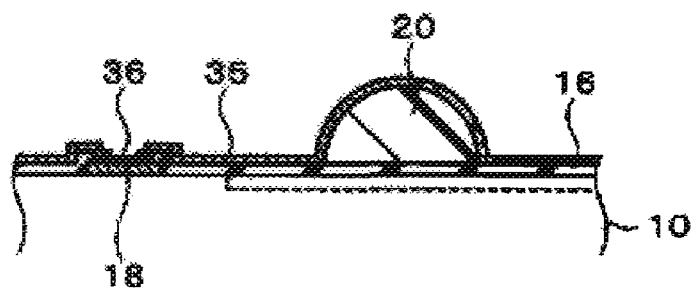
FIG. 8 is an explanatory views showing a method of manufacturing a semiconductor device according to a modification of the embodiment of the invention.
Figure 9:
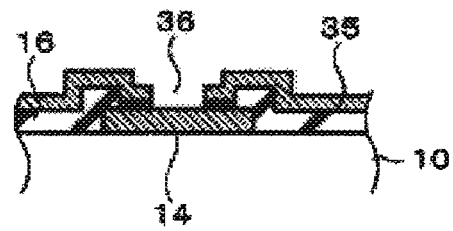
FIGS. 9A and 9B are explanatory views showing a method of manufacturing a semiconductor device according to the modification of the embodiment of the invention.
Figure 9:
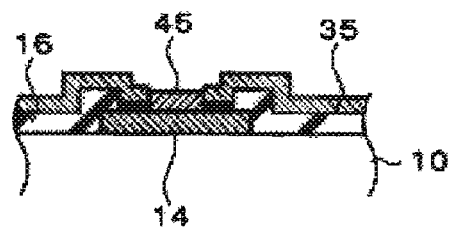

A method of manufacturing a semiconductor device according to the modification of the embodiment of the invention includes forming a metal layer 35, as shown in FIG. 8. The metal layer 35 may be a metal foil. Also, the metal layer 35 may be formed so as to cover the entire surface of the resin projection 20. The metal layer 35 may be formed so as to have an opening 36 therein. The opening 36 may be formed so as to expose at least a part of the oxidized film 18. For example, the metal layer 35 may be formed by forming the metal foil so as to cover all of the oxidized film 18, the passivation film 16 and the resin projection 20, and then forming the opening 36 for exposing the oxidized film 18.

The method of manufacturing a semiconductor device according to the modifications above includes forming an electrically connecting portion 45 for electrically connecting the electrode pad 14 to the metal layer 35 by substituting an electrical conductor for at least a part of the oxidized film 18, as shown in FIGS. 9A and 9B. This process, as shown in FIG. 9A, may include removing a part of the oxidized film 18. For example, a part of the oxidized film 18 overlapping the opening 36 of the metal layer 35 may be removed. In this case, argon gas may be used for removing the oxidized film 18. This process also may expose a part of the electrode pad 14. Thereafter, an electrical conductor may be disposed in the opening 36 to form the electrically connecting portion 45, as shown in FIG. 9B.

Figure 10:
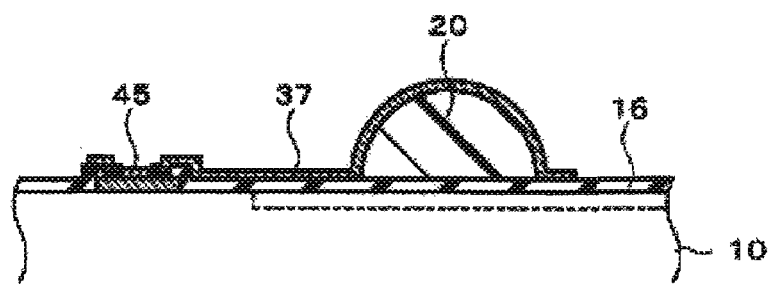
FIG. 10 is an explanatory view showing a method of manufacturing a semiconductor device according to the modification of the embodiment of the invention.

The method of manufacturing a semiconductor device according to the modification above includes patterning of the metal layer 35, as shown in FIG. 10. A wiring pattern 37 may be formed by patterning the metal layer 35.

The method described above may be employed to manufacture a semiconductor device. According to the method, as shown in FIG. 8, at the time of removing the oxidized film 18, the resin projection 20 is covered by the metal layer 35. Accordingly, even when argon gas is used to remove the oxidized film 18, surface carbonization of the resin projection 20 can be prevented. Therefore, the method enables manufacturing of a highly reliable semiconductor device in which an electrical short circuit hardly occurs between the wiring patterns 37.

The present invention is not limited to the embodiments described above, and various modifications can be made. For example, the invention includes the substantially same structure (e.g. a structure with the same function, method and results, or a structure with the same advantages and results) as those explained in the embodiments above. The invention also includes structures having parts that replace nonessential parts of the structures explained in the embodiments. Furthermore, the invention includes structures capable of providing the same operational effects or achieving the same advantages as those of the structures explained in the embodiments. Additionally, the invention includes structures obtained by adding known art techniques to those explained in the embodiments.

What is claimed is:

1. A method of manufacturing a semiconductor device, comprising:
   preparing a semiconductor substrate having an electrode pad, a passivation film having an opening overlapping the electrode pad and an oxidized film formed in the opening;
   forming a resin projection on the passivation film;

forming a metal layer on the passivation film and the resin projection; and forming an electrically connecting portion for electrically connecting the electrode pad to the metal layer by substituting an electrical conductor for at least a part of the oxidized film.

2. The method of manufacturing a semiconductor device according to claim 1, wherein in the process of electrically connecting the electrode pad to the metal layer, the electrically connecting portion is formed by substituting the electrical conductor for at least a part of the oxidized film by immersion plating.

3. The method of manufacturing a semiconductor device according to claim 1, wherein the electrode pad is formed of aluminum and the electrically connecting portion is formed of nickel.

4. The method of manufacturing a semiconductor device according to claim 1, wherein a second metal layer is formed on the electrically connecting portion and the metal layer.

5. The method of manufacturing a semiconductor device according to claim 1, wherein the metal layer is formed such that the metal layer has a through hole positioned on the oxidized film in the forming of the metal layer.

* * * * *